US012362022B2

(12) United States Patent
Binfet et al.

(10) Patent No.: US 12,362,022 B2
(45) Date of Patent: Jul. 15, 2025

(54) SCHEDULED INTERRUPTS FOR PEAK POWER MANAGEMENT TOKEN RING COMMUNICATION

(71) Applicant: Micron Technology, Inc., Boise, ID (US)

(72) Inventors: Jeremy Binfet, Boise, ID (US); Liang Yu, Boise, ID (US); Jonathan S. Parry, Boise, ID (US)

(73) Assignee: Micron Technology, Inc., Boise, ID (US)

(*) Notice: Subject to any disclaimer, the term of this patent is extended or adjusted under 35 U.S.C. 154(b) by 169 days.

(21) Appl. No.: 18/229,249

(22) Filed: Aug. 2, 2023

(65) Prior Publication Data

US 2024/0055058 A1 Feb. 15, 2024

Related U.S. Application Data

(60) Provisional application No. 63/398,076, filed on Aug. 15, 2022.

(51) Int. Cl.
*G11C 16/30* (2006.01)
*G11C 5/06* (2006.01)

(52) U.S. Cl.
CPC ................ *G11C 16/30* (2013.01); *G11C 5/06* (2013.01)

(58) Field of Classification Search
CPC ....... G11C 16/30; G11C 5/06; G11C 16/0483; G11C 5/14
See application file for complete search history.

(56) References Cited

U.S. PATENT DOCUMENTS

| | | | | |
|---|---|---|---|---|
| 11,561,597 B2 * | 1/2023 | Kinsley | ................ | G06F 1/3275 |
| 2019/0114099 A1 * | 4/2019 | Jeon | ................ | G11C 16/32 |
| 2020/0104062 A1 * | 4/2020 | Cho | ................ | G06F 3/0619 |
| 2022/0148663 A1 * | 5/2022 | Guo | ................ | G11C 16/32 |
| 2022/0172767 A1 * | 6/2022 | Yu | ................ | G11C 11/4074 |
| 2024/0143501 A1 * | 5/2024 | Nubile | ................ | G06F 1/3275 |
| 2024/0290396 A1 * | 8/2024 | Yu | ................ | G11C 16/30 |

* cited by examiner

*Primary Examiner* — Khamdan N. Alrobaie
(74) *Attorney, Agent, or Firm* — Lowenstein Sandler LLP

(57) ABSTRACT

A memory die includes a memory array and control logic, operatively coupled with the memory array, to perform operations including receiving a peak power management (PPM) token during a current PPM cycle, in response to receiving the PPM token, determining, based on a set of communication frequencies, whether to communicate auxiliary data to at least one other memory die during the current PPM cycle, wherein each communication frequency of the set of communication frequencies indicates when a respective type of auxiliary data is eligible for communication during a PPM cycle, and in response to determining to communicate auxiliary data to the at least one other memory die, causing a selected type of auxiliary data to be communicated to the at least one other memory die, wherein the selected type of auxiliary data is determined from the set of communication frequencies in view of the current PPM cycle.

20 Claims, 10 Drawing Sheets

SCHEDULED INTERRUPTS FOR PEAK POWER MANAGEMENT TOKEN RING COMMUNICATION

CROSS-REFERENCE TO RELATED APPLICATION(S)

The present application claims the benefit of U.S. Provisional Application 63/398,076, filed on Aug. 15, 2022 and entitled "SCHEDULE INTERRUPTS FOR PEAK POWER MANAGEMENT TOKEN RING COMMUNICATION", the entire contents of which are incorporated by reference herein.

TECHNICAL FIELD

Embodiments of the disclosure relate generally to memory sub-systems, and more specifically, relate to scheduled interrupts for token ring communication in a memory device implementing peak power management (PPM).

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
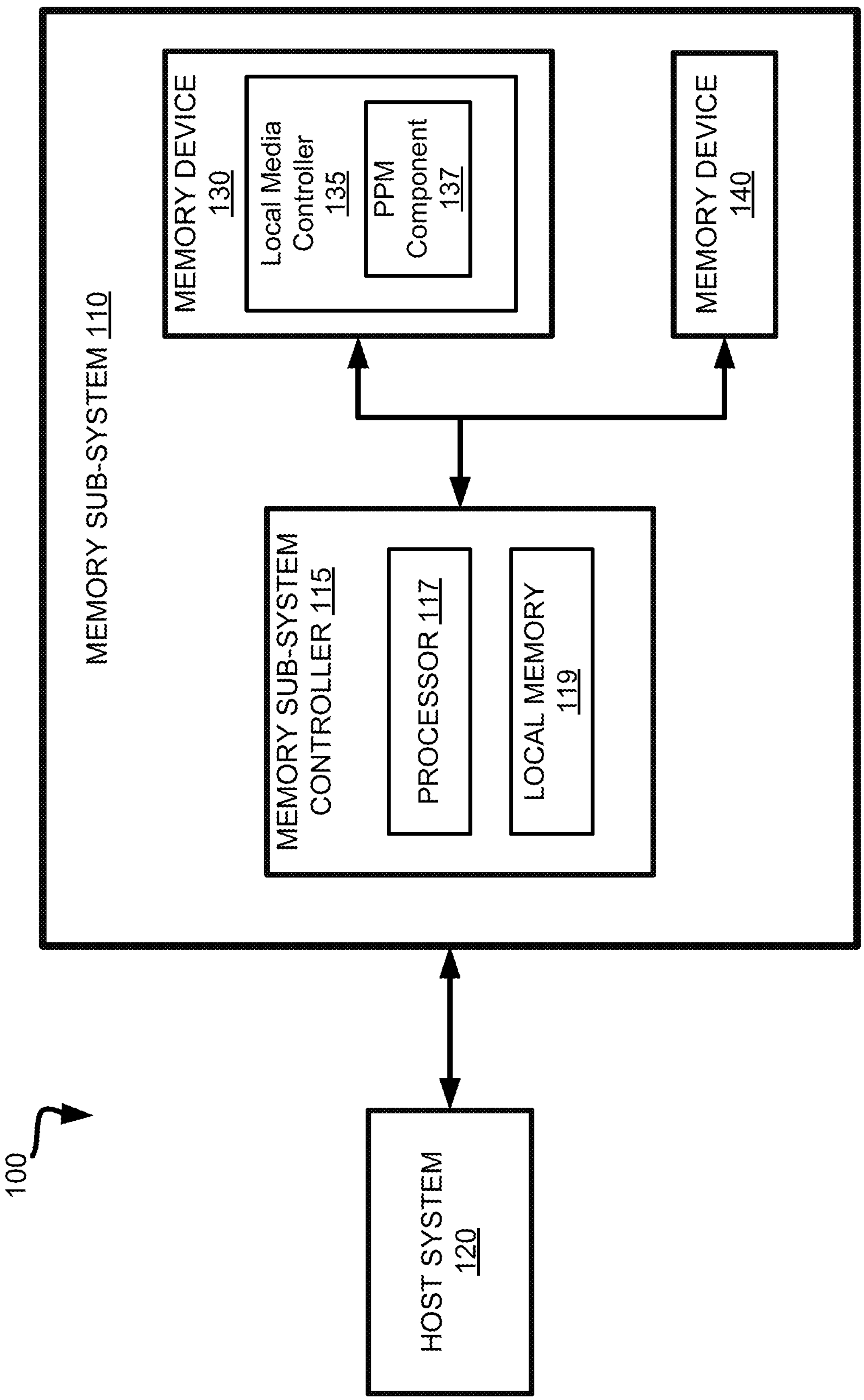
FIG. 1A illustrates an example computing system that includes a memory sub-system in accordance with some embodiments of the present disclosure.

Aspects of the present disclosure are directed to utilizing scheduled interrupts for token ring communication in a memory device implementing peak power management (PPM). A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. The memory cells are formed onto a silicon wafer in an array of columns (also hereinafter referred to as bitlines) and rows (also hereinafter referred to as wordlines). A wordline can refer to one or more conductive lines of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be generally referred to as independent plane driver circuits. Control logic on the memory device includes a number of separate processing threads to perform concurrent memory access operations (e.g., read operations, program operations, and erase operations). For example, each processing thread corresponds to a respective one of the memory planes and utilizes the associated independent plane driver circuits to perform the memory access operations on the respective memory plane.

As these processing threads operate independently, the power usage and requirements associated with each processing thread also varies.

A memory device can be a three-dimensional (3D) memory device. For example, a 3D memory device can be a three-dimensional (3D) replacement gate memory device (e.g., 3D replacement gate NAND), which is a memory device with a replacement gate structure using wordline stacking. For example, a 3D replacement gate memory device can include wordlines, select gates, etc. located between sets of layers including a pillar (e.g., polysilicon pillar), a tunnel oxide layer, a charge trap (CT) layer, and a dielectric (e.g., oxide) layer. A 3D replacement gate memory device can have a "top deck" corresponding to a first side and a "bottom deck" corresponding to a second side. For example, the first side can be a drain side and the second side can be a source side. Data in a 3D replacement gate memory device can be stored as 1 bit/memory cell (SLC), 2 bits/memory cell (MLC), 3 bits/memory cell (TLC), etc.

Various access lines, data lines and voltage nodes can be charged or discharged very quickly during sense (e.g., read or verify), program, and erase operations so that memory array access operations can meet the performance specifications that are often required to satisfy data throughput targets as might be dictated by customer requirements or industry standards, for example. For sequential read or programming, multi-plane operations are often used to increase the system throughput. As a result, a memory device can have a high peak current usage, which might be four to five times the average current amplitude. Thus, with such a high average market requirement of total current usage budget, it can become challenging to concurrently operate more than a certain number of memory dies ("dies") of a memory device.

Peak power management (PPM) can be utilized as a technique to manage power consumption of a memory device containing multiple dies, many of which rely on a controller to stagger the activity of the dies seeking to avoid performing high power portions of memory access operations concurrently in more than one die. A PPM system can implement a PPM communication protocol, which is an inter-die communication protocol that can be used for limiting and/or tracking current or power consumed by each die. Each die can include a PPM component that exchanges information with its own local media controller (e.g., NAND controller) and other PPM components of the other dies via a communication bus. Each PPM component can be configured to perform power or current budget arbitration for the respective die. For example, each PPM component can implement predictive PPM to perform predictive power budget arbitration for the respective memory device.

The PPM communication protocol can employ a token-based round robin protocol, whereby each PPM component rotates as a holder of a PPM token in accordance with a token circulation time period. Circulation of the token among the memory devices can be controlled by a common clock signal ("ICLK"). For example, the dies can include a designated primary die that generates the common clock signal received by each active PPM component, with the remaining dies being designated as secondary dies. The token circulation time period can be defined by a number of clock cycles of the common clock signal, and the memory device can pass the token to the next memory device after the number of clock cycles has elapsed.

A die counter can be used to keep track of which die is holding the token. Each die counter value can be univocally associated with a respective die by utilizing a special PPM address for each die. The die counter can be updated upon the passing of the token to the next die.

While holding the token, the PPM component broadcasts, to the other dies, information encoding the amount of current used by its respective die during a given time period (e.g., a quantized current budget). The information can be broadcast using a data line. For example, the data line can be a high current (HC #) data line. The amount of information can be defined by a sequence of bits, where each bit corresponds to the logic level of a data line signal (e.g., an HC # signal) at a respective clock cycle (e.g., a bit has a value of "0" if the HC # signal is logic low during a clock cycle, or a value of "1" if the clock pulse is logic high during a clock cycle). For example, if a die circulates the token after three clock cycles, then the information can include three bits. More specifically, a first bit corresponds to the logic level of the HC # signal during a first clock cycle, a second bit corresponds to the logic level of the HC # signal during a second clock cycle, and a third bit corresponds to the logic level of the HC # signal during the third clock cycle. Accordingly, the token circulation time period (e.g., number of clock cycles) can be defined in accordance with the amount of information to be broadcast by a holder of the token (e.g., number of bits).

While holding the token, the PPM component can issue a request for a certain amount of current to be reserved in order to execute a memory access operation. The system can have a designated maximum current budget, and at least a portion of the maximum current budget may be currently reserved for use by the other memory dies. Thus, an available current budget can be defined as the difference between the maximum current budget and the total amount of reserved current budget during the current token circulation cycle. If the amount of current of the request is less than or equal to the available current budget during the current cycle, then the request is granted and the local media controller can cause the memory access operation to be executed. Otherwise, if the amount of current of the new request exceeds the available current budget, then the local media controller can be forced to wait for sufficient current budget to be made available by the other die(s) to execute the memory access operation (e.g., wait at least one current token circulation cycle).

Each PPM component can maintain the information broadcast by each die (e.g., within respective registers), which enables each die to calculate the current consumption. For example, if there are four dies Die 0 through Die 3, each Die 0 through Die 3 can maintain information broadcast by Die 0 through Die 3 within respective registers designated for Die 0 through Die 3. Since each of Die 0 through Die 3 maintains the maximum current budget the most updated current consumption, each of Die 0 through Die 3 can calculate the available current budget. Accordingly, each of Die 0 through Die 3 can determine whether there is a sufficient amount of available current budget for its local media controller to execute a new memory access operation.

A memory access operation (e.g., program operation, read operation or erase operation) can include multiple sub-operations arranged in an execution sequence. For example, the sub-operations can include an initial sub-operation to initiate the memory access operation, a final sub-operation to complete the memory access operation. The sub-operations can further include at least one intermediate sub-operation performed between the initial sub-operation and the final sub-operation. For each sub-operation, for the local media controller to determine whether there is sufficient available current budget to proceed with execution of the sub-operation, the sub-operation can be assigned a current breakpoint. Each current breakpoint is defined (e.g., as a PPM parameter during initialization of PPM) at the beginning of its respective sub-operation to indicate whether the sub-operation will consume more current, less current, or the same amount of current as the previous sub-operation. Accordingly, current breakpoints can be used as a gating mechanism to control execution of a memory access operation.

For example, a high current (HC) breakpoint indicates that its respective sub-operation will be consuming an amount of current that is greater than the amount of current consumed to execute the previous sub-operation. Thus, the PPM component may have to reserve additional current to enable the local media controller to execute the sub-operation. For example, a first HC breakpoint can be defined with respect to an initial sub-operation of the memory access operation, since the initial sub-operation will necessarily consume a greater amount of current than the zero amount of current that was being consumed immediately before requesting execution of the memory access operation. Upon reaching a HC breakpoint, the local media controller can communicate, with the PPM component, the amount of current that the memory device will be consuming to execute the respective sub-operation. The local media controller waits to receive a response (e.g., flag) indicating that there is sufficient available current budget that can be reserved for executing the respective sub-operation. Upon receiving the response from that PPM component that there is sufficient available current budget that can be reserved for executing the respective sub-operation, the local media controller can proceed with executing the respective sub-operation. Accordingly, the local media controller will execute a sub-operation at a HC breakpoint only if the PPM component indicates that there is sufficient available current in the current budget to do so.

In contrast to a HC breakpoint, a low current (LC) breakpoint indicates that its respective sub-operation will be consuming an amount of current that is less than or equal to the amount of current consumed to execute the previous sub-operation. Since the PPM component had already reserved enough current for executing the previous sub-operation, the local media controller will, upon reaching a LC breakpoint, proceed with executing the respective sub-operation using at least a portion of the already reserved current. However, the local media controller still communicates, with the PPM component, the amount of current that the memory device will be consuming to perform the sub-operation. For example, the PPM component can release an unused portion of the reserved current for the other dies.

Illustratively, if the memory access operation is a read operation, then the read operation can include a prologue sub-operation as the initial sub-operation, a read initialization sub-operation following the prologue sub-operation, a sensing sub-operation following the read initialization sub-operation, and a read recovery sub-operation following the sensing sub-operation. Respective HC breakpoints can be defined for the prologue sub-operation (as the initial sub-operation) and the read initialization sub-operation (since the read initialization sub-operation consumes more current than the prologue sub-operation). Respective LC breakpoints can be defined for the sensing sub-operation (since the sensing sub-operation does not consume more current than the read initialization sub-operation) and the read recovery sub-operation (since the read recovery sub-operation does not consume more current than the sensing sub-operation).

The PPM token ring communication scheme described above is serial, meaning that only one die is actively driving data at any given time. More specifically, in a given PPM cycle, only the die in possession of the PPM token can communicate data to the other dies of the PPM network. For example, the data can be a data packet. The data packet can have a size (e.g., fixed size) defined by the PPM protocol. For example, the data packet can include a set of bits, where the set of bits includes a number of bits defined by a token ring resolution. Illustratively, if a PPM network includes four dies and the token ring resolution is three bits, then each die can report three bits of data within a PPM cycle (i.e., 12 total bits of data).

Token ring delay refers to the amount of time it takes for a die to report the data packet to the other dies during a PPM cycle. The token ring delay can be determined as a function of the total number of die (N), the size of the data packet (e.g., the number of bits) (S), and ICLK. For example, token ring delay (D) can be determined using the following equation:

$$D=(N-1)\times S\times \mathrm{ICLK}.$$

In view of the above, increasing the size of the data packet can increase the token ring delay. For example, increasing the token ring resolution from three bits to four bits in order to communicate four bits of data during a PPM cycle can increase the token ring delay by about 33%. This increase in token ring delay can increase resource consumption and overhead for implementing PPM. Accordingly, it can be computationally costly for a die, during a PPM cycle communicating a data packet including PPM data, to communicate additional non-PPM data (i.e., auxiliary data) to the other dies by appending the auxiliary data to the data packet.

Aspects of the present disclosure address the above and other deficiencies by utilizing scheduled interrupts for token ring communication in a memory device implementing PPM. Embodiments described herein can schedule interrupts to PPM data communication among dies of a token ring group of a PPM network during respective PPM cycles. During each interrupt, each die of the token ring group can communicate auxiliary data, instead of the typical PPM data, to the other dies of the token ring group. For example, PPM data can be data related to current consumption and/or current reservation, and auxiliary data refers to non-PPM data that is not related to current consumption and/or current reservation. The auxiliary data can be communicated via a data packet having the same size as the data packet for communicating PPM data. For example, the size of the data packet can be defined by the token ring resolution for the PPM protocol (e.g., three bits of data).

The auxiliary data packet can include a set of code bits, where each set of code bits defines a respective type of auxiliary data communicated during the PPM cycle (e.g., three code bits). Examples of types of auxiliary data can include priority status, self-test data, bits per cell operation, etc. Priority status data can be used by a die to request that priority status be assigned to its memory access operation (e.g., cause the other dies to suspend their memory access operations until completion of the priority memory access operation). Self-test data can be used to synchronize the dies of the token group, since the token group can become desynchronized after a certain amount of time. For example, self-test data can be used to synchronize the dies of the token group due to possible events such as random noise, a die missing a PPM cycle, etc.

To implement scheduled interrupts, a controller operatively coupled to a PPM component of a die can utilize a set of one or more auxiliary data communication frequencies ("communication frequencies"). The set of communication frequencies can be maintained within a scheduled interrupt data structure (e.g., table). More specifically, each communication frequency can define when a respective type of auxiliary data is eligible for communication during a PPM cycle (instead of PPM data). For example, the communication frequency for each type of auxiliary data can be a PPM cycle value, such that the type of auxiliary data is eligible to be communicated when the PPM cycle index is a multiple of the PPM cycle value. Each PPM cycle value can be defined by a respective power of two. For example, if the PPM cycle value of a particular type of auxiliary data is 64 cycles, then auxiliary data having that type is eligible to be communicated when the PPM cycle index is a multiple of 64 (64, 128, etc.) The set of communication frequencies can be predefined during PPM initialization (e.g., a default set of intervals) and/or can be configured by a user (i.e., programmable).

The controller, upon receiving a PPM token for communicating data during a current PPM cycle, can determine whether at least one type of auxiliary data is eligible for communication during the current PPM cycle using the set of communication frequencies. For example, determining whether at least one type of auxiliary data is eligible for communication during the current PPM cycle can include determining whether the PPM cycle index of the current PPM cycle is a multiple of at least one PPM cycle value defined for the at least one type of auxiliary data.

If the controller determines that there is no auxiliary data eligible to be communicated during the current PPM cycle, this means that PPM data communication should not be interrupted during the current PPM cycle. Thus, the controller can cause PPM data to be communicated to the other dies during the current PPM cycle.

Otherwise, if the controller determines that at least one type of auxiliary data is eligible for communication during the current PPM cycle, this means that PPM data communication should be interrupted to enable communication of auxiliary data. Thus, the controller can select a type of auxiliary data to be communicated to the other dies during the current PPM cycle, and cause auxiliary data of the selected type to be communicated.

More specifically, the type of auxiliary data can be selected using the set of communication frequencies in view of the number of PPM cycles. For example, if the set of communication frequencies includes a single communication frequency defined for a single type of auxiliary data (e.g., single PPM cycle value), then auxiliary data of the single type is selected.

However, if the set of communication frequencies includes multiple communication frequencies for respective types of auxiliary data (e.g., multiple PPM cycle values), then there may be scenarios in which at least two types of auxiliary data are eligible to be communicated during the current PPM cycle (e.g., the PPM cycle index of the current PPM cycle is a multiple of at least two PPM cycle values defined for at least two respective types of auxiliary data). During such scenarios, the controller can implement a "tiebreaker" mechanism to select the type of auxiliary data to be communicated to the other dies during the current PPM cycle. For example, the controller can select the type of auxiliary data that is communicated the least often due to having the lowest communication frequency (e.g., highest PPM cycle value). Illustratively, if the set of communication frequencies includes a PPM cycle value of 64 for a first type of auxiliary data and a value of 1024 for a second type of auxiliary data, and the current PPM cycle has a PPM cycle index of 1024, then the second type of auxiliary data can be selected for communication during the current PPM cycle.

The communication of the unselected type(s) of auxiliary data can be delayed. In some embodiments, the communication of an unselected type of auxiliary data can be delayed until the next time that unselected type of auxiliary data is eligible to be communicated (e.g., the PPM cycle index is a multiple of the of the PPM cycle value for the unselected type of auxiliary data. For example, in the above illustrative example, the communication of the first type of auxiliary data can be delayed until the PPM cycle index is 1088.

In the above example, the reason that an unselected type of auxiliary data is not communicated during the next PPM cycle is that it can interfere with the counting of the PPM cycle index. To address this situation, in some embodiments, the set of communication frequencies can include multiple communication frequencies for respective types of auxiliary data, where each communication frequency is defined with a respective offset. Each offset defines how long after the current PPM cycle that the unselected type of auxiliary data will be communicated.

If each communication frequency is a respective PPM cycle value, then each offset can be a respective PPM cycle index offset relative to the PPM index offset of the current PPM cycle. For example, the lowest PPM cycle value can be assigned a PPM cycle index offset of zero, the second lowest PPM cycle value can be assigned a PPM cycle index of one, the third lowest PPM cycle value can be assigned a PPM cycle index of two, etc. The PPM cycle index offset can be defined using modular arithmetic. Illustratively, assume that there are five PPM cycle values 16, 32, 64, 128 and 1024 each defined for a respective type of auxiliary data. The PPM cycle value of 16 can be defined with a PPM cycle offset of zero, the PPM cycle value of 32 can be defined with a PPM cycle offset of one, the PPM cycle value of 64 can be defined with a PPM cycle offset of two, the PPM cycle value of 128 can be defined with a PPM cycle offset of three, and the PPM cycle value of 1024 can be defined with a PPM cycle offset of four. Further assume that a current PPM cycle has a PPM cycle index of 1024, which is a multiple of all five PPM cycle values. In this scenario, the auxiliary data having the type defined by the PPM cycle value of 16 can be selected for communication during the current PPM cycle, which corresponds to the PPM cycle offset of zero. The auxiliary data having the type defined by the PPM cycle value of 32 can be selected for communication during the next PPM cycle, which corresponds to the PPM cycle offset of one (i.e., the PPM cycle having a PPM cycle index of 1025). The auxiliary data having the type defined by the PPM cycle value of 64 can be selected for communication during the next PPM cycle, which corresponds to the PPM cycle offset of two (i.e., the PPM cycle having a PPM cycle index of 1026). The auxiliary data having the type defined by the PPM cycle value of 128 can be selected for communication during the next PPM cycle, which corresponds to the PPM cycle offset of three (i.e., the PPM cycle having a PPM cycle index of 1027). The auxiliary data having the type defined by the PPM cycle value of 1024 can be selected for communication during the next PPM cycle, which corresponds to the PPM cycle offset of four (i.e., the PPM cycle having a PPM cycle index of 1028).

After communicating the PPM data or the auxiliary data during the current PPM cycle, the controller can cause the PPM token to be passed to the next die in the token ring group (e.g., to the PPM component of the next die). If the die that just communicated the PPM data or the auxiliary data is the final die of the token ring group, then the die can complete the PPM cycle upon communicating the PPM data or the auxiliary data, and the next PPM cycle can begin upon passing the PPM token to the first die of the token ring group (i.e., the PPM cycle index is increased by one). Further details regarding utilizing scheduled interrupts for token ring communication will be described in further detail below with reference to FIGS. 1A-7.

Advantages of the present disclosure include, but are not limited to, improved memory sub-system performance and QoS. For example, the impact on memory sub-system performance and QoS can be proportional to the scheduled interrupt frequency, which is less than the impact resulting from adding one bit of data to the token ring resolution. Accordingly, enabling a die to communicate auxiliary data to other dies of the PPM network during scheduled interrupts of PPM data reporting cycles can reduce fixed performance impacts related to token ring delay and overhead, as compared to increasing token ring resolution and the number of bits of data communicated to the other dies during each cycle.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can utilize scheduled interrupts for token ring communication during PPM. In such an embodiment, PPM component 137 can be implemented using hardware or as firmware, stored on memory device 130, executed by the control logic (e.g., local media controller 135) to perform the operations related to performing a memory access operation during PPM as described herein. In some embodiments, the memory sub-system controller 115 includes at least a portion of PPM component 137. For example, the memory sub-system controller 115 can include a processor 117 (e.g., a processing device) configured to execute instructions stored in local memory 119 for performing the operations described herein.

To utilize schedule interrupts for token ring communication during PPM, local media controller 135 can initialize PPM. For example, the local media controller can initialize PPM with respect to a PPM network of the memory sub-system 110 after power up of the memory sub-system 110. The PPM network can include multiple dies forming a token ring group. The token ring group is an ordered group of dies. The token ring group can include a primary die and a number of secondary dies. For example, the first die of the token ring group can be assigned to be the primary die. The primary die can be responsible for controlling the passing of a PPM token using a clock signal (ICLK).

Initializing PPM can include initializing a set of PPM parameters. The set of PPM parameters include a number of parameters defining the operation of PPM within the PPM network. For example, the set of PPM parameters can include current budget, the number of die of the token ring group, a size of data packets communicated by each die of the token ring group during a PPM cycle (e.g., a token ring resolution defining a number of bits of data), a configuration of the position of each die within the token ring group (i.e., to define the order of the dies within the token ring group), etc.

Initializing PPM can further include initializing a set of auxiliary data communication frequencies ("communication frequencies"). For example, the set of communication frequencies can be maintained within a scheduled interrupt data structure (e.g., table). More specifically, each communication frequency can define when a respective type of auxiliary data is eligible for communication during a PPM cycle (instead of PPM data). For example, the communication frequency for each type of auxiliary data can be a PPM cycle value, such that the type of auxiliary data is eligible to be communicated when the PPM cycle index is a multiple of the PPM cycle value. Each PPM cycle value can be defined by a respective power of two. For example, if the PPM cycle value of a particular type of auxiliary data is 64 cycles, then auxiliary data having that type is eligible to be communicated when the PPM cycle index is a multiple of 64 (64, 128, etc.) The set of communication frequencies can be predefined during PPM initialization (e.g., a default set of intervals) and/or can be configured by a user (i.e., programmable).

Upon receiving a PPM token from another die of the token ring group during a current PPM cycle, the local media controller 135 can cause data to be communicated during the current PPM cycle. In some embodiments, the PPM token is received from the primary die. In some embodiments, PPM token is received from a secondary die. If the PPM token is received from a final die within the order defined by the token ring group, then the current PPM cycle is a new PPM cycle relative to the previous PPM cycle completed by the final die. If the PPM token is received from the final die, then receiving the PPM token can further include initializing the current PPM cycle. For example, initializing the current PPM cycle can include updating the PPM cycle index for the current PPM cycle. For example, the PPM cycle index can be maintained by a counter, and updating the PPM cycle index can include increasing the counter by one relative to the previous PPM cycle.

Causing data to be communicated during the current PPM cycle can include determining whether to communicate auxiliary data. For example, the ppm component 137 can determine, based on the set of communication frequencies, whether at least one type of auxiliary data is eligible for communication during the current PPM cycle. For example, determining whether at least one type of auxiliary data is eligible for communication during the current PPM cycle can include determining whether the PPM cycle index of the current PPM cycle is a multiple of at least one PPM cycle value defined for the at least one type of auxiliary data.

If it is determined that there is no auxiliary data eligible to be communicated during the current PPM cycle, this means that PPM data communication should not be interrupted during the current PPM cycle. Thus, the ppm component 137 can cause PPM data to be communicated to the other dies of the token ring group during the current PPM cycle. More specifically, the local media controller can cause the PPM data to be communicated, via the PPM component 137, to the PPM components of the other dies. The PPM data can be communicated as a data packet having a data packet size, which can be initialized as a parameter of the set of parameters. For example, the data packet size can be defined by a token ring resolution defining a number of bits of data (e.g., three bits of data).

If it is determined that at least one type of auxiliary data is eligible to be communicated during the current PPM cycle, this means that PPM data communication should be interrupted to enable communication of auxiliary data (e.g., the PPM cycle index of the current PPM cycle is a multiple of at least one number of PPM cycles corresponding at least one type of auxiliary data). Thus, the PPM component 137 can cause the auxiliary data to be communicated to the other dies of the token ring group during the current PPM cycle. More specifically, control logic can cause the auxiliary data to be communicated, via the PPM component 137, to the PPM components of the other dies. Similar to the PPM data, the auxiliary data can be communicated as a data packet having the data packet size. The auxiliary data has an auxiliary data type (e.g., priority status, self-test data, or bits per cell operation). For example, the auxiliary data packet can include a set of code bits defined for the type of auxiliary data (e.g., three bits of data).

Causing the auxiliary data to be communicated to the other dies of the token ring group can include selecting the type of auxiliary data to be communicated to the other dies during the current PPM cycle, and cause auxiliary data of the selected type to be communicated. More specifically, the type of auxiliary data can be selected by the local media controller 135 based on the set of communication frequencies (e.g., number of PPM cycles). For example, if the set of communication frequencies includes a single communication frequency defined for a single type of auxiliary data (e.g., single PPM cycle value), then auxiliary data of the single type is selected. However, if the set of communication frequencies includes multiple communication frequencies for respective types of auxiliary data (e.g., multiple PPM cycle values), then there may be scenarios in which at least two types of auxiliary data are eligible to be communicated during the current PPM cycle (e.g., the PPM cycle index of the current PPM cycle is a multiple of at least two PPM cycle values defined for at least two respective types of auxiliary data).

During such scenarios, the PPM component 137 can implement a "tiebreaker" mechanism to select the type of auxiliary data to be communicated to the other dies during the current PPM cycle. For example, the local media controller 135 can select the type of auxiliary data that is communicated the least often due to having the lowest communication frequency (e.g., highest PPM cycle value). Illustratively, if the set of communication frequencies includes a PPM cycle value of 64 for a first type of auxiliary data and a value of 1024 for a second type of auxiliary data, and the current PPM cycle has a PPM cycle index of 1024, then the second type of auxiliary data can be selected for communication during the current PPM cycle.

The communication of the unselected type(s) of auxiliary data can be delayed. In some embodiments, the communication of an unselected type of auxiliary data can be delayed until the next time that unselected type of auxiliary data is eligible to be communicated (e.g., the PPM cycle index is a multiple of the of the PPM cycle value for the unselected type of auxiliary data). For example, in the above illustrative example, the communication of the first type of auxiliary data can be delayed until the PPM cycle index is 1088.

In the above example, the reason that an unselected type of auxiliary data is not communicated during the next PPM cycle is that it can interfere with the counting of the PPM cycle index. To address this situation, in some embodiments, the set of communication frequencies can include multiple communication frequencies for respective types of auxiliary data, where each communication frequency is defined with a respective offset. Each offset defines how long after the current PPM cycle that the unselected type of auxiliary data will be communicated.

If each communication frequency is a respective PPM cycle value, then each offset can be a respective PPM cycle index offset relative to the PPM index offset of the current PPM cycle. For example, the lowest PPM cycle value can be assigned a PPM cycle index offset of zero, the second lowest PPM cycle value can be assigned a PPM cycle index of one, the third lowest PPM cycle value can be assigned a PPM cycle index of two, etc. The PPM cycle index offset can be defined using modular arithmetic.

Illustratively, assume that there are five PPM cycle values 16, 32, 64, 128 and 1024 each defined for a respective type of auxiliary data. The PPM cycle value of 16 can be defined with a PPM cycle offset of zero, the PPM cycle value of 32 can be defined with a PPM cycle offset of one, the PPM cycle value of 64 can be defined with a PPM cycle offset of two, the PPM cycle value of 128 can be defined with a PPM cycle offset of three, and the PPM cycle value of 1024 can be defined with a PPM cycle offset of four. Further assume that a current PPM cycle has a PPM cycle index of 1024, which is a multiple of all five PPM cycle values. In this scenario, the auxiliary data having the type defined by the PPM cycle value of 16 can be selected for communication during the current PPM cycle, which corresponds to the PPM cycle offset of zero. The auxiliary data having the type defined by the PPM cycle value of 32 can be selected for communication during the next PPM cycle, which corresponds to the PPM cycle offset of one (i.e., the PPM cycle having a PPM cycle index of 1025). The auxiliary data having the type defined by the PPM cycle value of 64 can be selected for communication during the next PPM cycle, which corresponds to the PPM cycle offset of two (i.e., the PPM cycle having a PPM cycle index of 1026). The auxiliary data having the type defined by the PPM cycle value of 128 can be selected for communication during the next PPM cycle, which corresponds to the PPM cycle offset of three (i.e., the PPM cycle having a PPM cycle index of 1027). The auxiliary data having the type defined by the PPM cycle value of 1024 can be selected for communication during the next PPM cycle, which corresponds to the PPM cycle offset of four (i.e., the PPM cycle having a PPM cycle index of 1028).

After communicating the data to the other dies (i.e., the PPM data or the auxiliary data), the PPM component 137 can cause the PPM token to be passed to the next die of the token ring group. The process can repeat upon receiving the PPM token during the next PPM cycle. Further details regarding utilizing scheduled interrupts for token ring communication during PPM will now be described below with reference to FIGS. 1B-7.

Figure 1B:
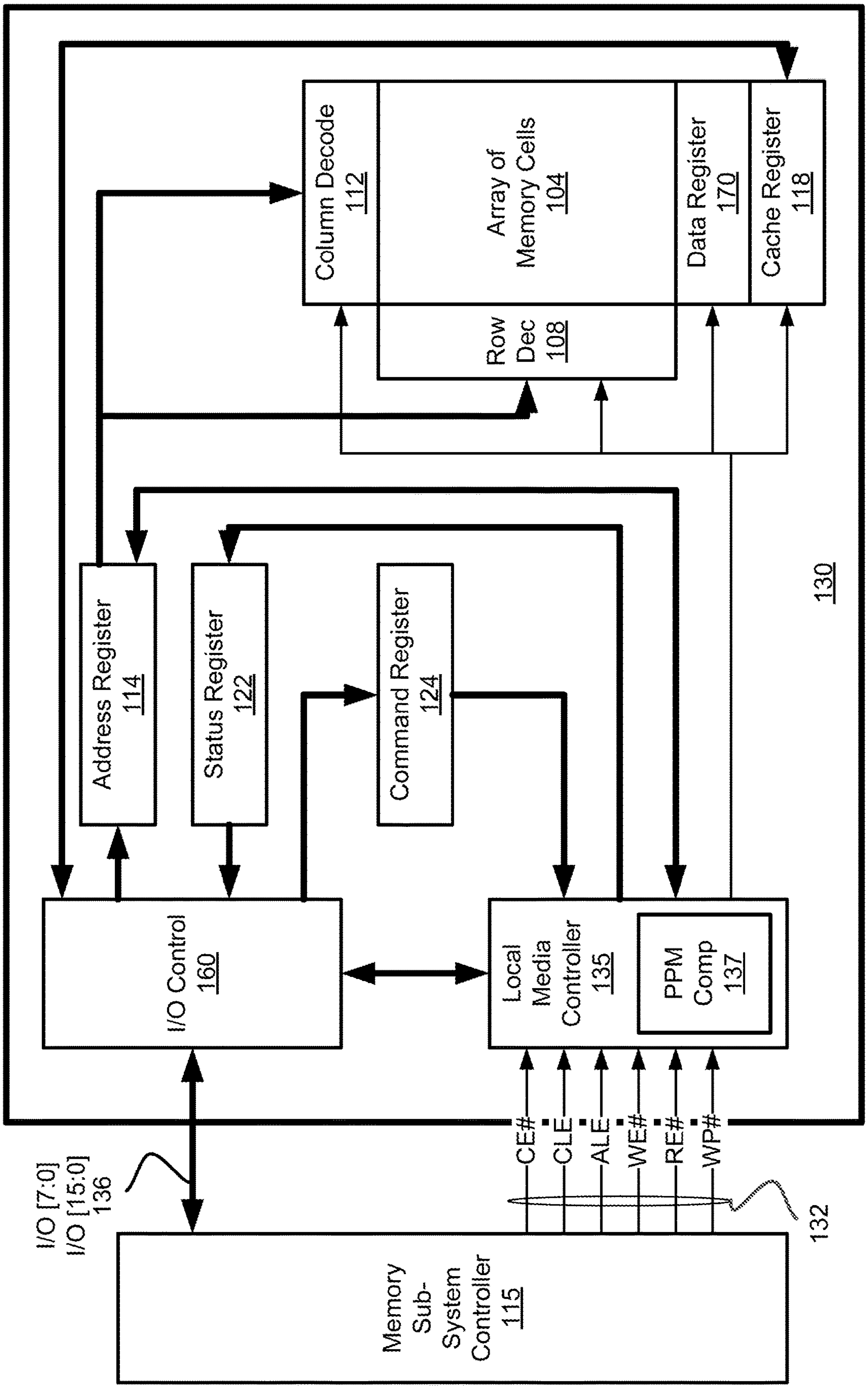
FIG. 1B is a block diagram of a memory device in communication with a memory sub-system controller of a memory sub-system in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 112 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 112 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 112 to control the row decode circuitry 108 and column decode circuitry 112 in response to the addresses. In one embodiment, local media controller 135 includes the PPM component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
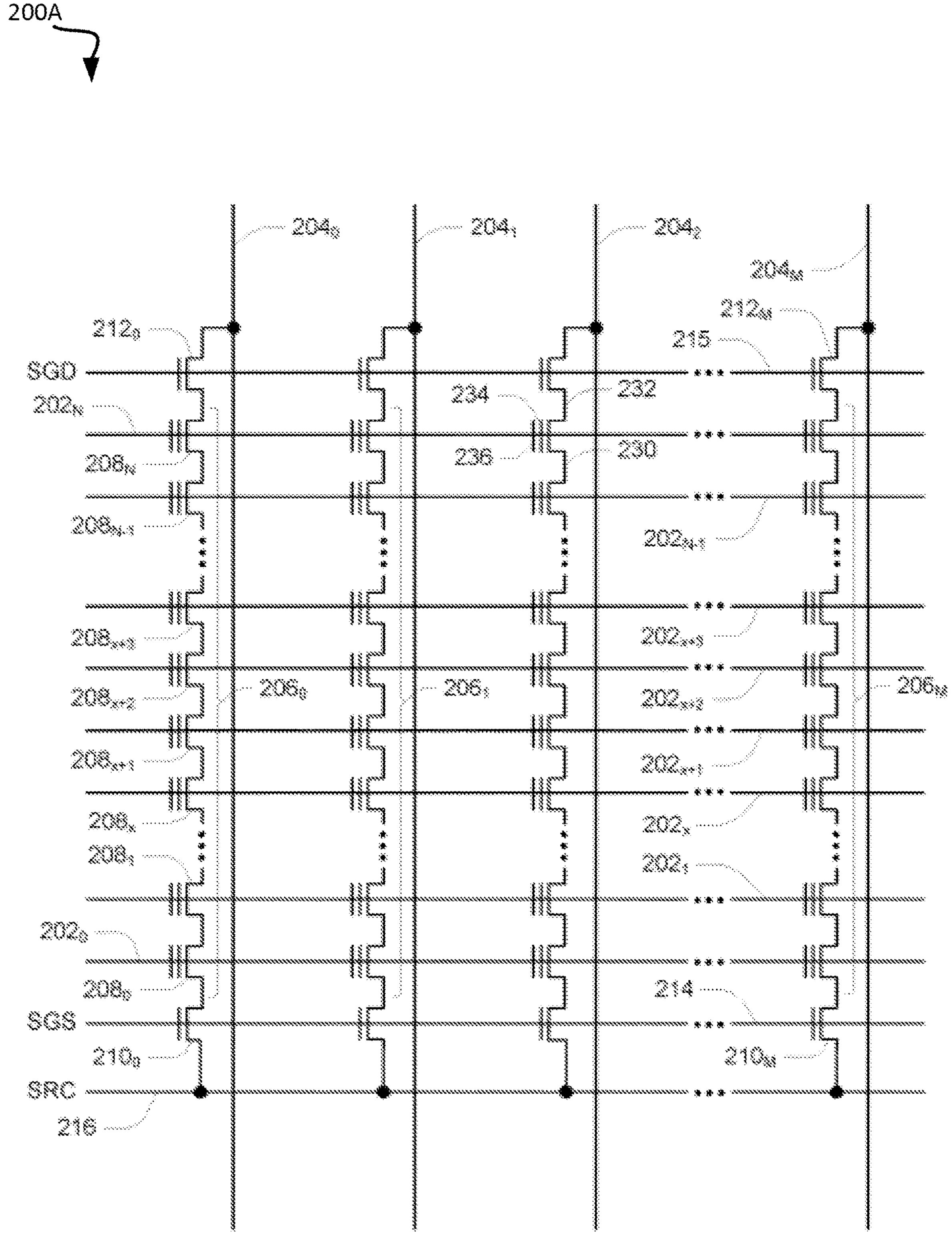
FIGS. 2A-2C are diagrams of portions of an example array of memory cells included in a memory device, in accordance with some embodiments of the present disclosure.
Figure 2B:
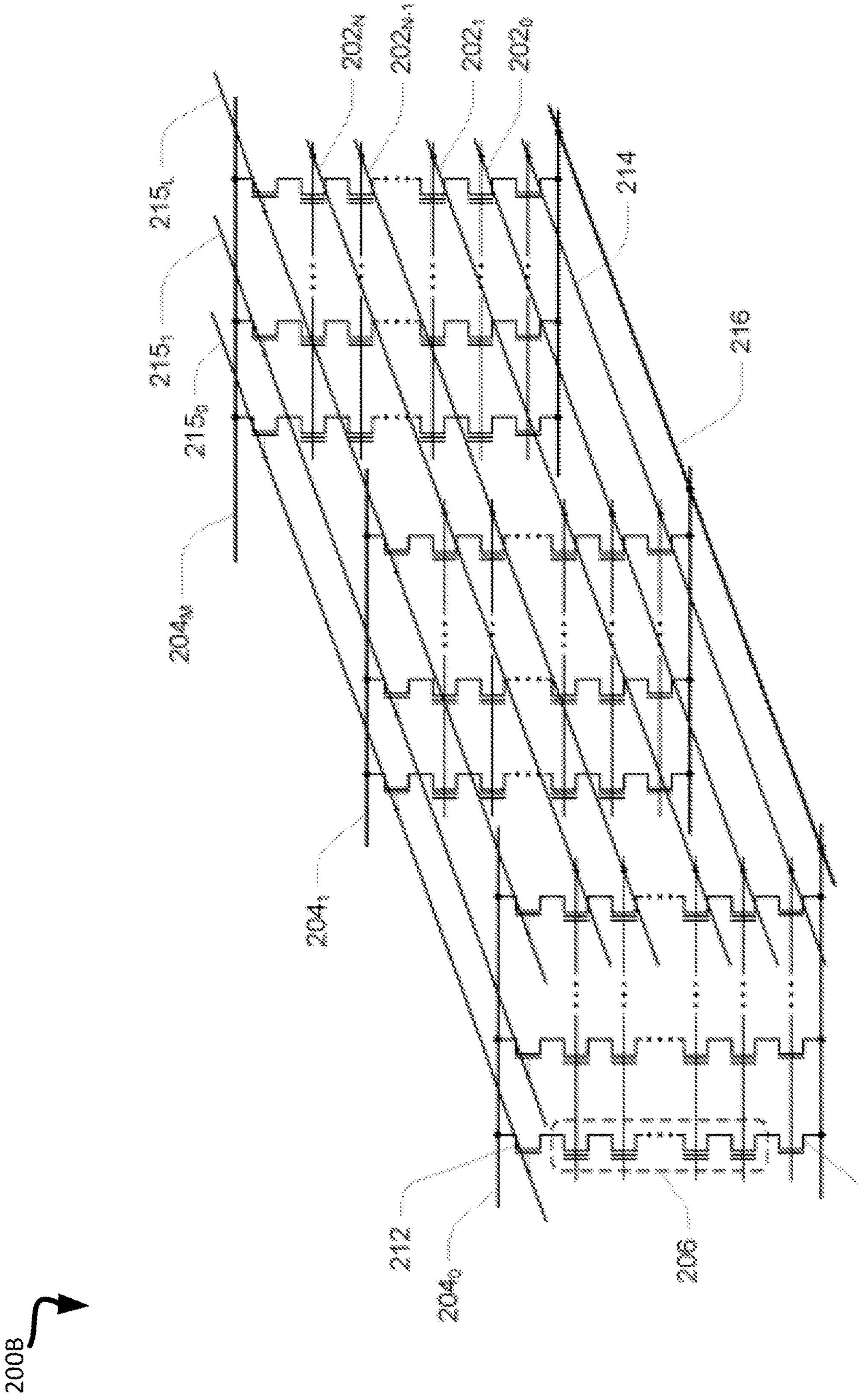
Figure 2C:
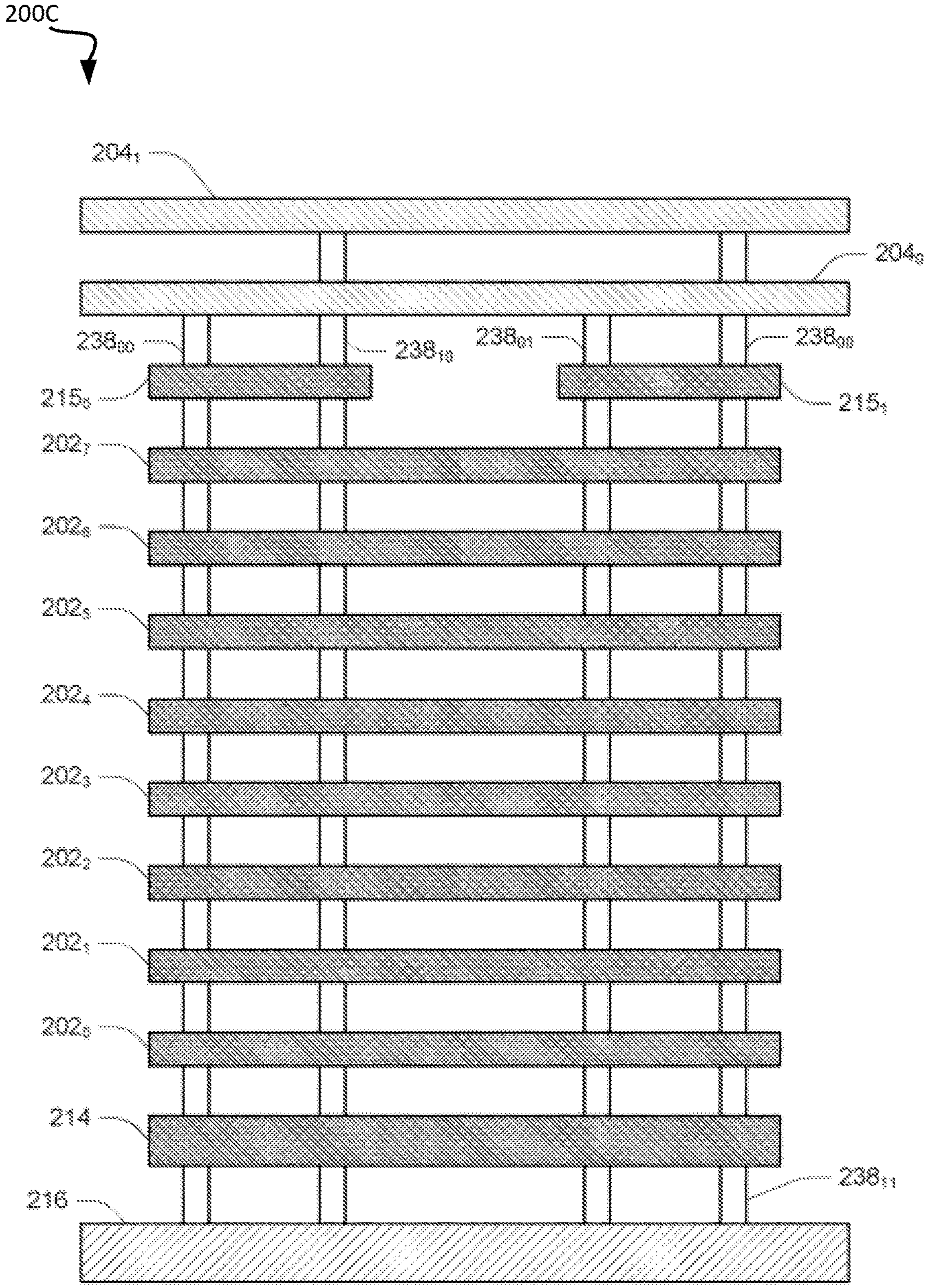

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $\mathbf{202}_0$ to $\mathbf{202}_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $\mathbf{202}_N$ and selectively connected to even bitlines 204 (e.g., bitlines $\mathbf{204}_0$, $\mathbf{204}_2$, $\mathbf{204}_4$, etc.) may be one physical page of memory cells 208 (e.g., even memory cells) while memory cells 208 commonly connected to wordline $\mathbf{202}_N$ and selectively connected to odd bitlines 204 (e.g., bitlines $\mathbf{204}_1$, $\mathbf{204}_3$, $\mathbf{204}_5$, etc.) may be another physical page of memory cells 208 (e.g., odd memory cells). Although bitlines $\mathbf{204}_3$-$\mathbf{204}_5$ are not explicitly depicted in FIG. 2A, it is apparent from the figure that the bitlines 204 of the array of memory cells 200A may be numbered consecutively from bitline $\mathbf{204}_0$ to bitline $\mathbf{204}_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $\mathbf{202}_0$-$\mathbf{202}_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $\mathbf{206}_0$ to $\mathbf{206}_M$. Each string 206 can be connected (e.g., selectively connected) to a source line 216 (SRC) and can include memory cells $\mathbf{208}_0$ to $\mathbf{208}_N$. The memory cells 208 of each string 206 can be connected in series between a select gate 210, such as one of the select gates $\mathbf{210}_0$ to $\mathbf{210}_M$, and a select gate 212, such as one of the select gates $\mathbf{212}_0$ to $\mathbf{212}_M$. In some embodiments, the select gates $\mathbf{210}_0$ to $\mathbf{210}_M$ are source-side select gates (SGS) and the select gates $\mathbf{212}_0$ to $\mathbf{212}_M$ are drain-side select gates. Select gates $\mathbf{210}_0$ to $\mathbf{210}_M$ can be connected to a select line 214 (e.g., source-side select line) and select gates $\mathbf{212}_0$ to $\mathbf{212}_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $\mathbf{208}_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $\mathbf{208}_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $\mathbf{204}_0$-$\mathbf{204}_M$ by a select gate 212 and to the SRC 216 by a select gate 210. Multiple strings 206 can be selectively connected to the same bitline 204. Subsets of strings 206 can be connected to their respective bitlines 204 by biasing the select lines $\mathbf{215}_0$-$\mathbf{215}_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) $\mathbf{238}_{00}$ and $\mathbf{238}_{01}$ represent the channel regions of different strings of series-connected memory cells (e.g., strings 206 of FIGS. 2A-2B) selectively connected to the bitline $\mathbf{204}_0$. Similarly, channel regions $\mathbf{238}_{10}$ and $\mathbf{238}_{11}$ represent the channel regions of different strings of series-connected memory cells (e.g., NAND strings 206 of FIGS. 2A-2B) selectively connected to the bitline $\mathbf{204}_1$. A memory cell (not depicted in FIG. 2C) may be formed at each intersection of a wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

Figure 3:
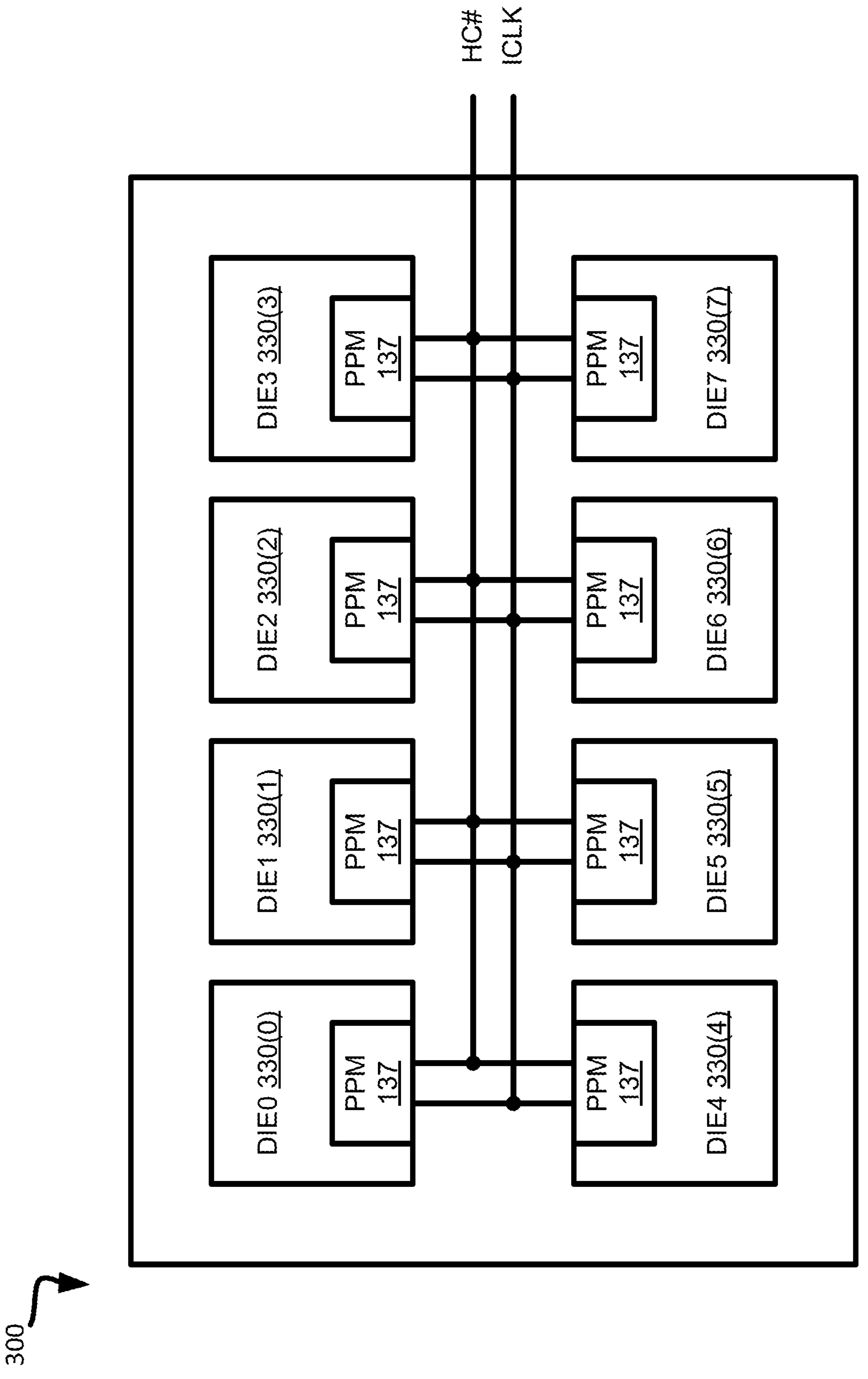
FIG. 3 is a block diagram illustrating a multi-die package with multiple memory dies in a memory sub-system, in accordance with some embodiments of the present disclosure.

FIG. 3 is a block diagram illustrating a multi-die package 300 with multiple memory dies in a memory sub-system, in accordance with some embodiments of the present disclosure. As illustrated, multi-die package 300 includes memory dies 330(0)-330(7). In other embodiments, however, multi-die package 300 can include some other number of memory dies, such as additional or fewer memory dies. In one embodiment, memory dies 330(0)-330(7) share a clock signal ICLK which is received via a clock signal line. Memory dies 330(0)-330(7) can be selectively enabled in response to a chip enable signal (e.g., via a control link), and can communicate over a separate I/O bus. In addition, a peak current magnitude indicator signal HC # is commonly shared between the memory dies 330(0)-330(7). The peak current magnitude indicator signal HC # can be normally pulled to a particular state (e.g., pulled high). In one embodiment, each of memory dies 330(0)-330(7) includes an instance of PPM component 137, which receives both the clock signal ICLK and the peak current magnitude indicator signal HC #.

In one embodiment, a token-based protocol is used where a token cycles through each of the memory dies 330(0)-330(7) for determining and broadcasting expected peak current magnitude, even though some of the memory dies 330(0)-330(7) might be disabled in response to their respective chip enable signal. The period of time during which a given PPM component 137 holds this token (e.g., a certain number of cycles of clock signal ICLK) can be referred to herein as a power management cycle of the associated memory die. At the end of the power management cycle, the token is passed to another memory die. Eventually the token is received again by the same PPM component 137, which signals the beginning of the power management cycle for the associated memory die. In one embodiment, the encoded value for the lowest expected peak current magnitude is configured such that each of its digits correspond to the normal logic level of the peak current magnitude indicator signal HC # where the disabled dies do not transition the peak current magnitude indicator signal HC #. In other embodiments, however, the memory dies can be configured, when otherwise disabled in response to their respective chip enable signal, to drive transitions of the peak current magnitude indicator signal HC # to indicate the encoded value for the lowest expected peak current magnitude upon being designated. When a given PPM component 137 holds the token, it can determine the peak current magnitude for the respective one of memory die 330(0)-330(7), which can be attributable to one or more processing threads on that memory die, and broadcast an indication of the same via the peak current magnitude indicator signal HC #. During a given power management cycle, the PPM component 137 can arbitrate among the multiple processing threads on the respective memory die using one of a number of different arbitration schemes in order to allocate that peak current to enable concurrent memory access operations.

Figure 4:
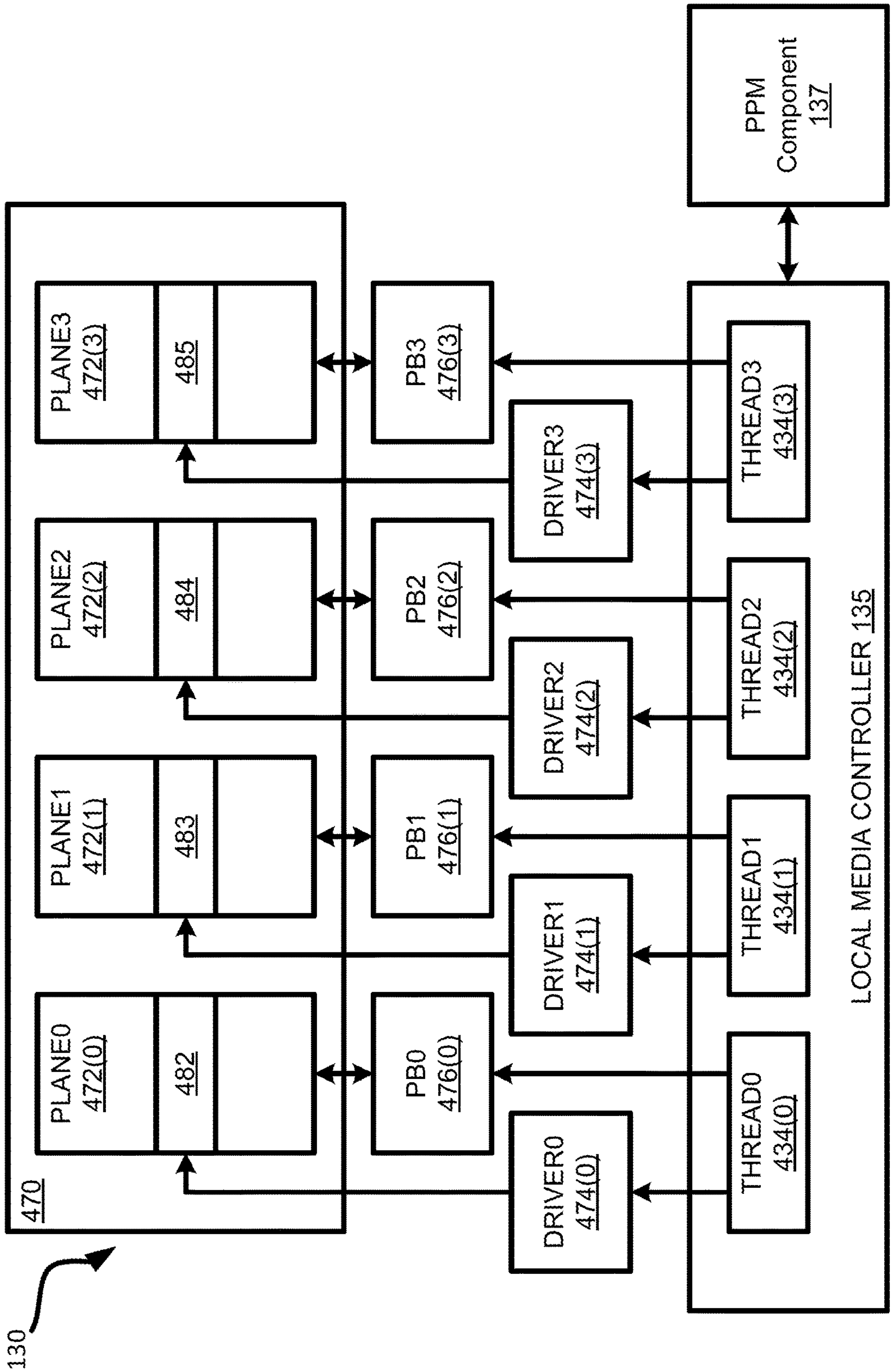
FIG. 4 is a block diagram illustrating a multi-plane memory device configured for independent parallel plane access, in accordance with some embodiments of the present disclosure.

FIG. 4 is a block diagram illustrating a multi-plane memory device 130 configured for independent parallel plane access, in accordance with some embodiments of the present disclosure. The memory planes 472(0)-472(3) can each be divided into blocks of data, with a different relative block of data from two or more of the memory planes 472(0)-472(3) concurrently accessible during memory access operations. For example, during memory access operations, two or more of data block 482 of the memory plane 472(0), data block 483 of the memory plane 472(1), data block 484 of the memory plane 472(2), and data block 485 of the memory plane 4372(3) can each be accessed concurrently.

The memory device 130 includes a memory array 470 divided into memory planes 472(0)-472(3) that each includes a respective number of memory cells. The multi-plane memory device 130 can further include local media controller 135, including a power control circuit and access control circuit for concurrently performing memory access operations for different memory planes 472(0)-472(3). The memory cells can be non-volatile memory cells, such as NAND flash cells, or can generally be any type of memory cells.

The memory planes 472(0)-472(3) can each be divided into blocks of data, with a different relative block of data from each of the memory planes 472(0)-472(3) concurrently accessible during memory access operations. For example, during memory access operations, data block 482 of the memory plane 472(0), data block 483 of the memory plane 472(1), data block 484 of the memory plane 472(2), and data block 485 of the memory plane 472(3) can each be accessed concurrently.

Each of the memory planes 472(0)-372(3) can be coupled to a respective page buffer 476(0)-476(3). Each page buffer 476(0)-376(3) can be configured to provide data to or receive data from the respective memory plane 472(0)-472(3). The page buffers 476(0)-476(3) can be controlled by local media controller 135. Data received from the respective memory plane 472(0)-472(3) can be latched at the page buffers 476(0)-476(3), respectively, and retrieved by local media controller 135, and provided to the memory sub-system controller 115 via the interface.

Each of the memory planes 472(0)-472(3) can be further coupled to a respective access driver circuit 474(0)-474(3), such as an access line driver circuit. The driver circuits 474(0)-474(3) can be configured to condition a page of a respective block of an associated memory plane 472(0)-472(3) for a memory access operation, such as programming data (i.e., writing data), reading data, or erasing data. Each of the driver circuits 474(0)-474(3) can be coupled to a respective global access lines associated with a respective memory plane 472(0)-472(3). Each of the global access lines can be selectively coupled to respective local access lines within a block of a plane during a memory access operation associated with a page within the block. The driver circuits 474(0)-474(3) can be controlled based on signals from local media controller 135. Each of the driver circuits

474(0)-474(3) can include or be coupled to a respective power circuit, and can provide voltages to respective access lines based on voltages provided by the respective power circuit. The voltages provided by the power circuits can be based on signals received from local media controller 135.

The local media controller 135 can control the driver circuits 474(0)-474(3) and page buffers 476(0)-476(3) to concurrently perform memory access operations associated with each of a group of memory command and address pairs (e.g., received from memory sub-system controller 115). For example, local media controller 135 can control the driver circuits 474(0)-474(3) and page buffer 476(0)-476(3) to perform the concurrent memory access operations. Local media controller 135 can include a power control circuit that serially configures two or more of the driver circuits 474 (0)-474(3) for the concurrent memory access operations, and an access control circuit configured to control two or more of the page buffers 476(0)-476(3) to sense and latch data from the respective memory planes 472(0)-472(3), or program data to the respective memory planes 472(0)-472(3) to perform the concurrent memory access operations.

In operation, local media controller 135 can receive a group of memory command and address pairs via the bus, with each pair arriving in parallel or serially. In some examples, the group of memory command and address pairs can each be associated with different respective memory planes 472(0)-472(3) of the memory array 470. The local media controller 135 can be configured to perform concurrent memory access operations (e.g., read operations or program operations) for the different memory planes 472 (0)-472(3) of the memory array 470 responsive to the group of memory command and address pairs. For example, the power control circuit of local media controller 135 can serially configure, for the concurrent memory access operations based on respective page type (e.g., UP, TP, LP, XP, SLC/MLC/TLC/QLC page), the driver circuits 474(0)-474 (3) for two or more memory planes 472(0)-472(3) associated with the group of memory command and address pairs. After the access line driver circuits 474(0)-474(3) have been configured, the access control circuit of local media controller 135 can concurrently control the page buffers 476 (0)-476(3) to access the respective pages of each of the two or more memory planes 472(0)-472(3) associated with the group of memory command and address pairs, such as retrieving data or writing data, during the concurrent memory access operations. For example, the access control circuit can concurrently (e.g., in parallel and/or contemporaneously) control the page buffers 476(0)-476(3) to charge/discharge bitlines, sense data from the two or more memory planes 472(0)-472(3), and/or latch the data.

Based on the signals received from local media controller 135, the driver circuits 474(0)-474(3) that are coupled to the memory planes 472(0)-472(3) associated with the group of memory command and address command pairs can select blocks of memory or memory cells from the associated memory plane 472(0)-472(3), for memory operations, such as read, program, and/or erase operations. The driver circuits 474(0)-474(3) can drive different respective global access lines associated with a respective memory plane 472(0)-472 (3). As an example, the driver circuit 474(0) can drive a first voltage on a first global access line associated with the memory plane 472(0), the driver circuit 474(1) can drive a second voltage on a third global access line associated with the memory plane 472(1), the driver circuit 474(2) can drive a third voltage on a seventh global access line associated with the memory plane 472(2), etc., and other voltages can be driven on each of the remaining global access lines. In some examples, pass voltages can be provided on all access lines except an access line associated with a page of a memory plane 472(0)-472(3) to be accessed. The local media controller 135, the driver circuits 474(0)-474(3) can allow different respective pages, and the page buffers 476 (0)-476(3) within different respective blocks of memory cells, to be accessed concurrently. For example, a first page of a first block of a first memory plane can be accessed concurrently with a second page of a second block of a second memory plane, regardless of page type.

The page buffers 476(0)-476(3) can provide data to or receive data from the local media controller 135 during the memory access operations responsive to signals from the local media controller 135 and the respective memory planes 472(0)-472(3). The local media controller 135 can provide the received data to memory sub-system controller 115.

It will be appreciated that the memory device 130 can include more or less than four memory planes, driver circuits, and page buffers. It will also be appreciated that the respective global access lines can include 8, 16, 32, 64, 128, etc., global access lines. The local media controller 135 and the driver circuits 474(0)-474(3) can concurrently access different respective pages within different respective blocks of different memory planes when the different respective pages are of a different page type. For example, local media controller 135 can include a number of different processing threads, such as processing threads 434(0)-434(3). Each of processing threads 434(0)-434(3) can be associated with a respective one of memory planes 472(0)-472(3), or a respective group of memory planes, and can manage operations performed on the respective plane or group of planes. For example, each of processing threads 434(0)-434(3) can provide control signals to the respective one of driver circuits 474(0)-474(3) and page buffers 476(0)-476(3) to perform those memory access operations concurrently (e.g., at least partially overlapping in time). Since the processing threads 434(0)-434(3) can perform the memory access operations, each of processing threads 434(0)-434(3) can have different current requirements at different points in time. PPM component 137 can determine the power budget needs of processing threads 434(0)-434(3) in a given power management cycle and identify one or more of processing threads 434(0)-434(3) using one of a number of power budget arbitration schemes described herein. The one or more processing threads 434(0)-434(3) can be determined based on an available power budget in the memory sub-system 110 during the power management cycles. For example, PPM component 137 can determine respective priorities of processing threads 434(0)-434(3), and allocate current to processing threads 434(0)-434(3) based on the respective priorities.

Figure 5A:
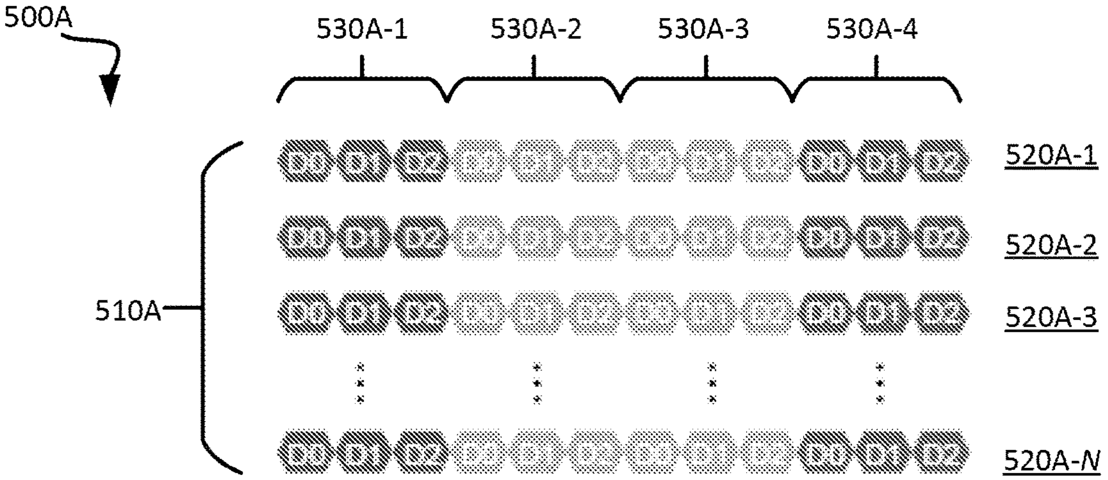
FIGS. 5A-5C are diagrams illustrating token ring communication in a memory device implementing peak power management (PPM), in accordance with some embodiments of the present disclosure.
Figure 5B:
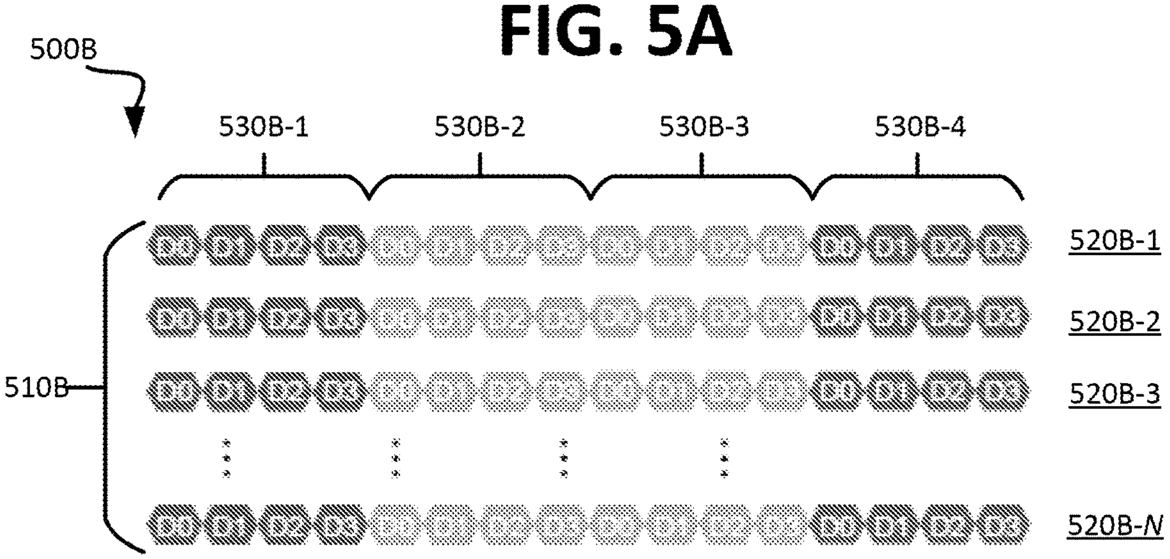
Figure 5C:
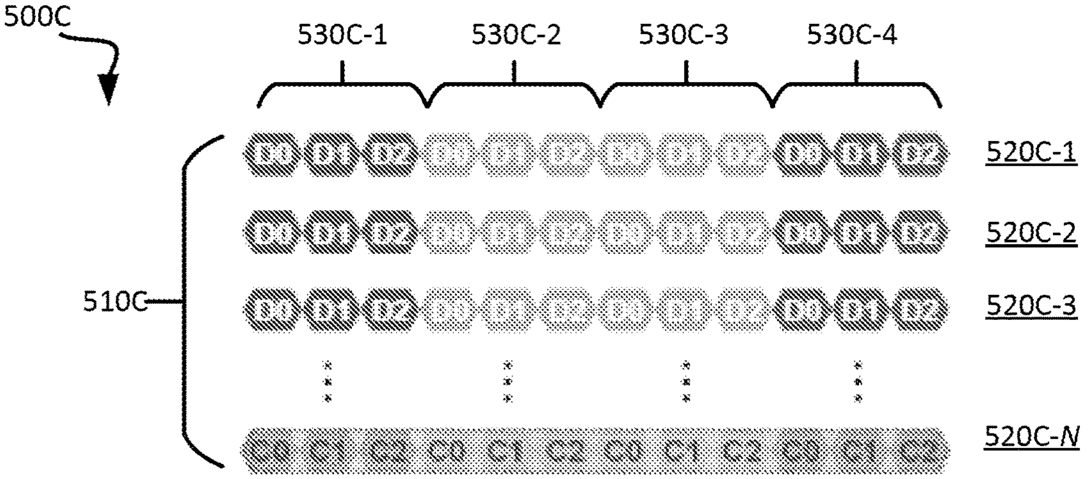

FIGS. 5A-5C are diagrams illustrating token ring communication in a memory device implementing PPM, in accordance with some embodiments of the present disclosure. In these illustrative examples, it is assumed that the PPM network includes a token ring group of four dies, Die 1 through Die 4. However, the number of dies of the token ring group should not be considered limiting.

FIG. 5A illustrates a diagram 500A of an overview of token ring communication. Diagram 500A shows a set of PPM cycles 510A, including PPM cycles 520A-1 through 520A-N. During each of the PPM cycles 520A-1 through 520A-N, Die 1 can communicate a PPM data packet 530A-1, Die 2 can communicate a PPM data packet 530A-2, Die 3 can communicate a PPM data packet 530A-3, and Die 4 can communicate a PPM data packet 530A-4. More specifically, each die can communicate its respective PPM data packet while it is in possession of the token. In this illustrative example, each of the PPM data packets 530A-1 through 530A-4 includes a respective set of bits "D0" through "D2". Thus, the token ring resolution in this example is three bits. However, the token ring resolution should not be considered limiting.

In some implementations, auxiliary data (i.e., non-PPM data) can be communicated by each of Die 1 through Die 4 to the other dies. For example, FIG. 5B illustrates a diagram 500B of auxiliary data communication by appending the auxiliary data to respective PPM data packets. Diagram 500B shows a set of PPM cycles 510B, including PPM cycles 520B-1 through 520B-N. During each of the PPM cycles 520B-1 through 520B-N, Die 1 can communicate a data packet 530B-1, Die 2 can communicate a data packet 530B-2, Die 3 can communicate a data packet 530B-3, and Die 4 can communicate a data packet 530B-4. Similar to FIG. 5A, each of Die 1 through Die 4 can communicate a respective data packet during a PPM cycle while it is in possession of the token. In contrast to FIG. 5A, auxiliary data is communicated along with PPM data during each of the PPM cycles 520B-1 through 520B-N. That is, each of the data packets 530B-1 through 530B-4 includes PPM data and auxiliary data communicated by respective ones of Die 1 through Die 4. In this illustrative example, each of the data packets 530B-1 through 530B-4 includes a set of PPM data bits "DO" through "D2" (similar to FIG. 5A), and a single auxiliary data bit "D3".

Thus, to append the single auxiliary data bit to the set of PPM data bits in the FIG. 5B example, the token ring resolution has been increased from three bits four bits. However, enabling Die 1 through Die 4 to communicate auxiliary data in the manner shown in FIG. 5B can increase token ring delay substantially relative to communicating PPM data only. The substantial increase in token ring delay can negatively impact memory sub-system performance and QoS.

To address these drawbacks, FIG. 5C illustrates a diagram 500C of auxiliary data communication by utilizing scheduled interrupts. The diagram 500C shows a set of PPM cycles 510C, including PPM cycles 520C-1 through 520C-N. During each of the PPM cycles 520C-1 through 520C-N, Die 1 can communicate a data packet 530C-1 while in possession of the PPM token during the PPM cycle, Die 2 can communicate a data packet 530C-2 while in possession of the PPM token during the PPM cycle, Die 3 can communicate a data packet 530C-3 while in possession of the PPM token during the PPM cycle, and Die 4 can communicate a data packet 530C-4 while in possession of the PPM token during the PPM cycle. It is assumed that the token ring resolution in this example is three bits. However, the token ring resolution should not be considered limiting.

In this illustrative example, the data packets 530C-1 through 530C-4 that are communicated by Die 1 through Die 4, respectively, during each of the PPM cycles 520C-1 through 520C-(N-1) are PPM data packets. For example, as shown, each of the data packets 530C-1 through 530C-4 communicated during each of the PPM cycles 520C-1 through 520C-(N-1) can include a set of PPM data bits "DO" through "D2" (similar to the set of PPM data bits described above with reference to FIG. 5A).

In this illustrative example, an interrupt is scheduled for communicating PPM data during PPM cycle 520C-N. In other words, during PPM cycle 520-N, Die 1 through Die 4 can each communicate auxiliary data instead of PPM data. Thus, the data packets 530C-1 through 530C-4 that are communicated by Die 1 through Die 4, respectively, during the PPM cycle 520C-N are auxiliary data packets. For example, as shown, each of the data packets 530C-1 through 530C-4 communicated during each of the PPM cycle 520C-N includes a set of auxiliary data bits "CO" through "C2". The set of auxiliary data bits CO through C2 can be a set of code bits defining the type of auxiliary data that is communicated during the PPM cycle 520C-N. Examples of types of auxiliary data can include priority status, self-test data, bits per cell operation, etc. The interrupt can be determined from a set of auxiliary data communication frequencies ("communication frequencies"), as described herein above with reference to FIG. 1A and as will be described in further detail below with reference to FIG. 6.

Figure 6:
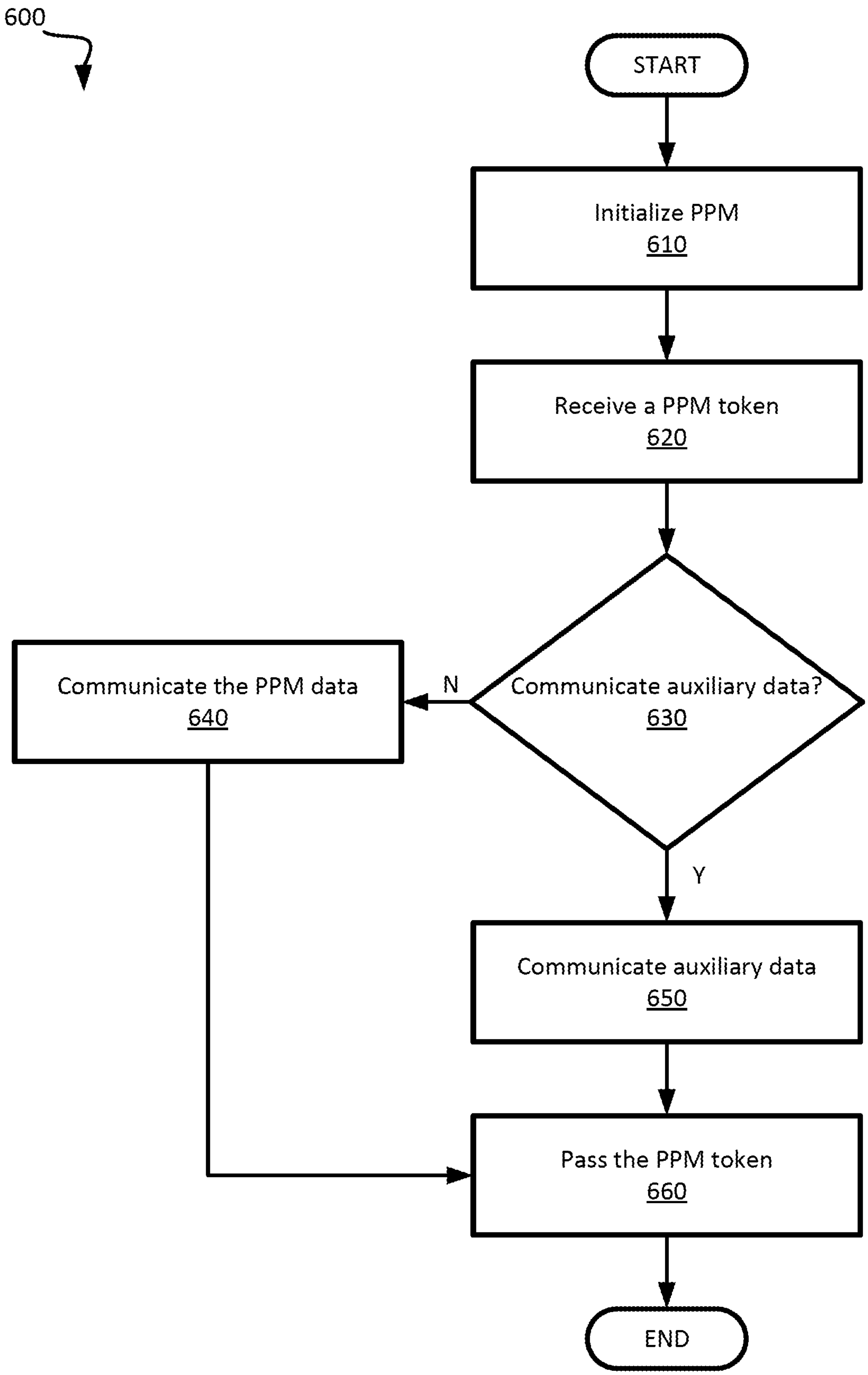
FIG. 6 is a flow diagram of a method to utilize scheduled interrupts for token ring communication in a memory device implementing peak power management (PPM), in accordance with some embodiments of the present disclosure.

FIG. 6 is a flow diagram of a method 600 to utilize scheduled interrupts for token ring communication in a memory device implementing PPM, in accordance with some embodiments of the present disclosure. The method 600 can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the local media controller 135 and/or the PPM component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, peak power management (PPM) is initialized. For example, control logic can initialize a PPM within a PPM network of a memory sub-system, such as the memory sub-system 110, after power up of the memory sub-system. The PPM network can include multiple dies forming a token ring group. The token ring group is an ordered group of dies. The token ring group can include a primary die and a number of secondary die. For example, the first die of the token ring group can be assigned to be the primary die. The primary die can be responsible for controlling the passing of a PPM token using a clock signal (ICLK).

Initializing PPM can include initializing a set of PPM parameters. The set of PPM parameters include a number of parameters defining the operation of PPM within the PPM network. For example, the set of PPM parameters can include current budget, the number of die of the token ring group, a size of data packets communicated by each die of the token ring group during a PPM cycle (e.g., a token ring resolution defining a number of bits of data), a configuration of the position of each die within the token ring group (i.e., to define the order of the dies within the token ring group), etc.

Initializing PPM can further include initializing a set of auxiliary data communication frequencies ("communication frequencies"). For example, the set of communication frequencies can be maintained within a scheduled interrupt data structure (e.g., table). More specifically, each communication frequency can define when a respective type of auxiliary data is eligible for communication during a PPM cycle (instead of PPM data). For example, the communication frequency for each type of auxiliary data can be a PPM cycle value, such that the type of auxiliary data is eligible to be communicated when the PPM cycle index is a multiple of the PPM cycle value. Each PPM cycle value can be defined by a respective power of two. For example, if the PPM cycle value of a particular type of auxiliary data is 64 cycles, then auxiliary data having that type is eligible to be communicated when the PPM cycle index is a multiple of 64 (64, 128, etc.) The set of communication frequencies can be predefined during PPM initialization (e.g., a default set of intervals) and/or can be configured by a user (i.e., programmable).

At operation 620, a PPM token is received. For example, control logic can receive the PPM token from another die of the token ring group. In some embodiments, the PPM token is received from the primary die. In some embodiments, PPM token is received from a secondary die. If the PPM token is received from a final die within the order defined by the token ring group, then the current PPM cycle is a new PPM cycle relative to the previous PPM cycle completed by the final die. If the PPM token is received from the final die, then receiving the PPM token can further include initializing the current PPM cycle. For example, initializing the current PPM cycle can include updating the PPM cycle index for the current PPM cycle. For example, the PPM cycle index can be maintained by a counter, and updating the PPM cycle index can include increasing the counter by one relative to the previous PPM cycle.

Upon receiving the PPM token, control logic can cause data to be communicated during the current PPM cycle. At operation 630, it is determined whether to communicate auxiliary data. For example, control logic can determine, based on the set of communication frequencies, whether at least one type of auxiliary data is eligible for communication during the current PPM cycle. For example, determining whether at least one type of auxiliary data is eligible for communication during the current PPM cycle can include determining whether the PPM cycle index of the current PPM cycle is a multiple of at least one PPM cycle value defined for the at least one type of auxiliary data.

If it is determined that there is no auxiliary data eligible to be communicated during the current PPM cycle at operation 630, this means that PPM data communication should not be interrupted during the current PPM cycle. Thus, at operation 640, PPM data is communicated. For example, control logic can cause the PPM data to be communicated to the other dies of the token ring group during the current PPM cycle. More specifically, control logic can cause the PPM data to be communicated to the other dies via their respective PPM components. The PPM data can be communicated as a data packet having a data packet size, which can be initialized at operation 610. For example, the data packet size can be defined by a token ring resolution defining a number of bits of data (e.g., three bits of data).

If it is determined that at least one type of auxiliary data is eligible to be communicated during the current PPM cycle at operation 630, this means that PPM data communication should be interrupted to enable communication of auxiliary data (e.g., the PPM cycle index of the current PPM cycle is a multiple of at least one number of PPM cycles corresponding at least one type of auxiliary data). Thus, at operation 650, auxiliary data is communicated. For example, control logic can cause the auxiliary data to be communicated to the other dies of the token ring group during the current PPM cycle. More specifically, control logic can cause the auxiliary data to be communicated to the other dies via their respective PPM components. Similar to the PPM data, the auxiliary data can be communicated as a data packet having the data packet size. The auxiliary data communicated at operation 650 has an auxiliary data type (e.g., priority status, self-test data, or bits per cell operation). For example, the auxiliary data packet can include a set of code bits defined for the type of auxiliary data (e.g., three bits of data).

Causing the auxiliary data to be communicated to the other dies of the token ring group can include selecting the type of auxiliary data to be communicated to the other dies during the current PPM cycle, and cause auxiliary data of the selected type to be communicated. More specifically, the type of auxiliary data can be selected based on the set of communication frequencies (e.g., number of PPM cycles). For example, if the set of communication frequencies includes a single communication frequency defined for a single type of auxiliary data (e.g., single PPM cycle value), then auxiliary data of the single type is selected. However, if the set of communication frequencies includes multiple communication frequencies for respective types of auxiliary data (e.g., multiple PPM cycle values), then there may be scenarios in which at least two types of auxiliary data are eligible to be communicated during the current PPM cycle (e.g., the PPM cycle index of the current PPM cycle is a multiple of at least two PPM cycle values defined for at least two respective types of auxiliary data).

During such scenarios, control logic can implement "tie-breaker" mechanism to select the type of auxiliary data to be communicated to the other dies during the current PPM cycle. For example, control logic can select the type of auxiliary data that is communicated the least often due to having the lowest communication frequency (e.g., highest PPM cycle value). Illustratively, if the set of communication frequencies includes a PPM cycle value of 64 for a first type of auxiliary data and a value of 1024 for a second type of auxiliary data, and the current PPM cycle has a PPM cycle index of 1024, then the second type of auxiliary data can be selected for communication during the current PPM cycle.

The communication of the unselected type(s) of auxiliary data can be delayed. In some embodiments, the communication of an unselected type of auxiliary data can be delayed until the next time that unselected type of auxiliary data is eligible to be communicated (e.g., the PPM cycle index is a multiple of the of the PPM cycle value for the unselected type of auxiliary data. For example, in the above illustrative example, the communication of the first type of auxiliary data can be delayed until the PPM cycle index is 1088.

In the above example, the reason that an unselected type of auxiliary data is not communicated during the next PPM cycle is that it can interfere with the counting of the PPM cycle index. To address this situation, in some embodiments, the set of communication frequencies can include multiple communication frequencies for respective types of auxiliary data, where each communication frequency is defined with a respective offset. Each offset defines how long after the current PPM cycle that the unselected type of auxiliary data will be communicated. If each communication frequency is a respective PPM cycle value, then each offset can be a respective PPM cycle index offset relative to the PPM index offset of the current PPM cycle. For example, the lowest PPM cycle value can be assigned a PPM cycle index offset of zero, the second lowest PPM cycle value can be assigned a PPM cycle index of one, the third lowest PPM cycle value can be assigned a PPM cycle index of two, etc. The PPM cycle index offset can be defined using modular arithmetic.

After communicating the PPM data at operation 640 or communicating the auxiliary data at operation 650, the PPM token can be passed at operation 660. For example, control logic can cause the PPM token to be passed to the next die of the token ring group. More specifically, control logic can cause the PPM token to be passed to the PPM component of the next die of the token ring group. Method 600 can be repeated in response to receiving the PPM token during the next PPM cycle. Further details regarding operations 610-660 are described above with reference to FIGS. 1A-5C.

Figure 7:
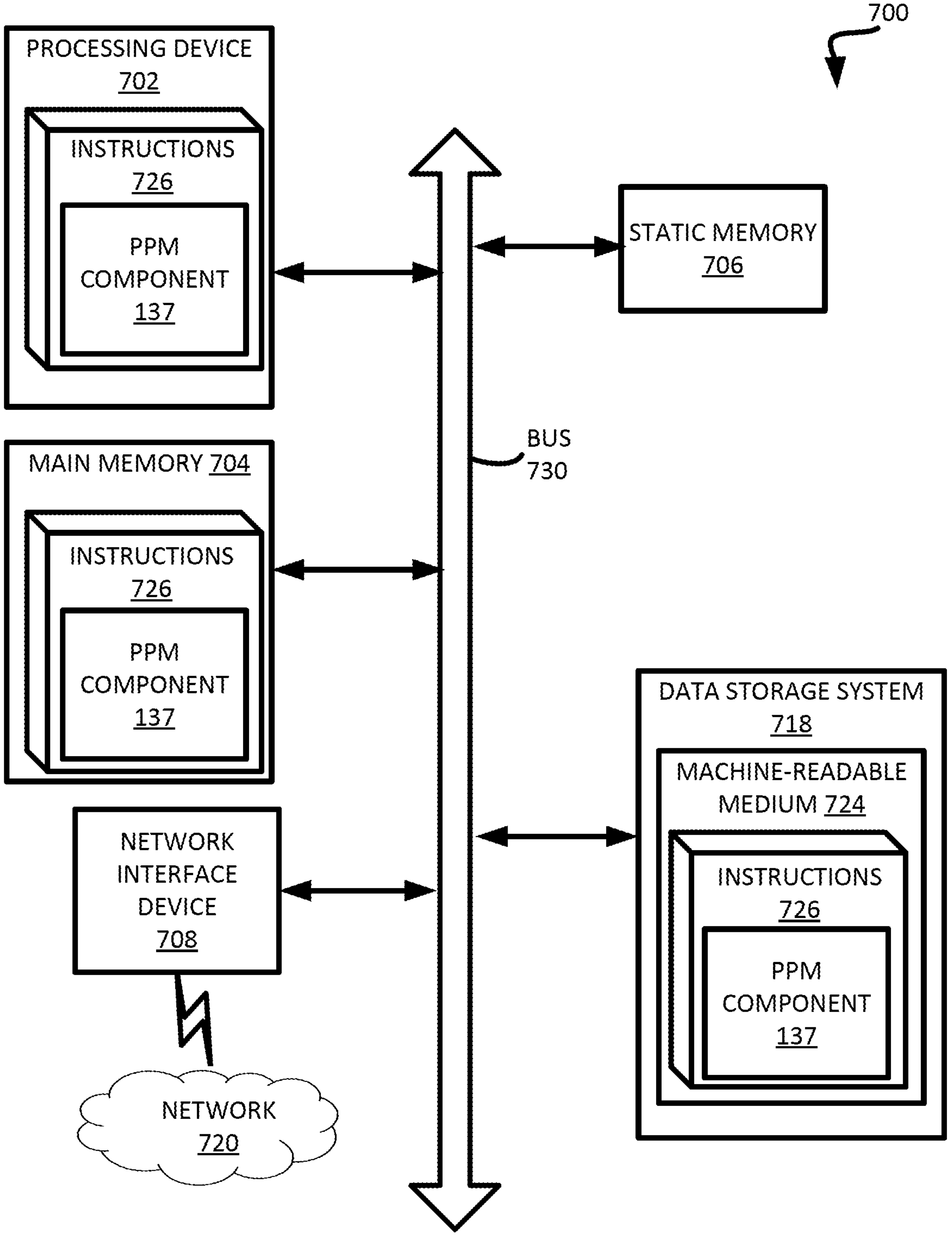
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the local media controller 135 and/or the PPM component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a local media controller and/or PPM component (e.g., the local media controller 135 and/or the PPM component 137 of FIG. 1A). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
- a plurality of memory dies, each memory die of the plurality of memory dies comprising;
  - a memory array; and
  - control logic, operatively coupled with the memory array, to perform operations comprising:
    - receiving a peak power management (PPM) token during a current PPM cycle;
    - in response to receiving the PPM token, determining, based on a set of communication frequencies, whether to communicate auxiliary data to at least one other memory die of the plurality of memory dies during the current PPM cycle, wherein each communication frequency of the set of communication frequencies indicates when a respective type of auxiliary data is eligible for communication during a PPM cycle; and
    - in response to determining to communicate auxiliary data to the at least one other memory die, causing a selected type of auxiliary data to be communicated to the at least one other memory die, wherein the selected type of auxiliary data is determined from the set of communication frequencies in view of the current PPM cycle.

2. The memory device of claim 1, wherein the operations further comprise initializing PPM, and wherein initializing PPM comprises initializing the set of communication frequencies.

3. The memory device of claim 1, wherein the selected type of auxiliary data is communicated as a data packet comprising a set of bits defined by a token ring resolution.

4. The memory device of claim 1, wherein each communication frequency of the set of communication frequencies is a PPM cycle value of a respective type of auxiliary data, and wherein determining whether to communicate auxiliary data to the at least one other memory die comprises determining whether a PPM cycle index of the current PPM cycle is a multiple of at least one PPM cycle value.

5. The memory device of claim 1, wherein causing the selected type of auxiliary data to be communicated to the at least one other memory die comprises selecting, from a plurality of types of auxiliary data eligible to be communicated during the current PPM cycle, a type of auxiliary data having a lowest communication frequency as the selected type of auxiliary data.

6. The memory device of claim 5, wherein each unselected type of auxiliary data of the plurality of types of auxiliary data eligible to be communicated during the current PPM cycle is communicated in accordance with a respective offset, and wherein each offset defines how long after the current PPM cycle that the unselected type of auxiliary data will be communicated.

7. The memory device of claim 6, wherein each communication frequency of the set of communication frequencies is a PPM cycle value of a respective type of auxiliary data, and wherein each offset is a respective PPM cycle index offset relative to a PPM cycle index of the current PPM cycle.

8. A method comprising:
- receiving, by a processing device, a peak power management (PPM) token during a current PPM cycle;
- in response to receiving the PPM token, determining, by the processing device based on a set of communication frequencies, whether to communicate auxiliary data to at least one memory die during the current PPM cycle, wherein each communication frequency of the set of communication frequencies indicates when a respective type of auxiliary data is eligible for communication during a PPM cycle; and
- in response to determining to communicate auxiliary data to the at least one other memory die, causing, by the processing device, a selected type of auxiliary data to be communicated to the at least one memory die, wherein the selected type of auxiliary data is determined from the set of communication frequencies in view of the current PPM cycle.

9. The method of claim 8, further comprising initializing, by the processing device, PPM, wherein initializing PPM comprises initializing the set of communication frequencies.

10. The method of claim 8, wherein the selected type of auxiliary data is communicated as a data packet comprising a set of bits defined by a token ring resolution.

11. The method of claim 8, wherein each communication frequency of the set of communication frequencies is a PPM cycle value of a respective type of auxiliary data, and wherein determining whether to communicate auxiliary data to the at least one memory die comprises determining whether a PPM cycle index of the current PPM cycle is a multiple of at least one PPM cycle value.

12. The method of claim 8, wherein causing the selected type of auxiliary data to be communicated to the at least one memory device comprises selecting, from a plurality of types of auxiliary data eligible to be communicated during the current PPM cycle, a type of auxiliary data having a lowest communication frequency as the selected type of auxiliary data.

13. The method of claim 12, wherein each unselected type of auxiliary data of the plurality of types of auxiliary data eligible to be communicated during the current PPM cycle is communicated in accordance with a respective offset, and wherein each offset defines how long after the current PPM cycle that the unselected type of auxiliary data will be communicated.

14. The method of claim 13, wherein each communication frequency of the set of communication frequencies is a PPM cycle value of a respective type of auxiliary data, and wherein each offset is a respective PPM cycle index offset relative to a PPM cycle index of the current PPM cycle.

15. A non-transitory computer-readable storage medium comprising instructions that, when executed by a processing device, cause the processing device to perform operations comprising:

initializing a set of auxiliary data communication frequencies, wherein each auxiliary data communication frequency of the set of auxiliary data communication frequencies indicates when a respective type of auxiliary data is eligible for communication during a peak power management (PPM) cycle;

selecting a type of auxiliary data to be communicated to at least one memory die during a current PPM cycle, wherein the type of auxiliary data is selected based on the set of auxiliary data communication frequencies in view of the current PPM cycle; and causing the type of auxiliary data to be communicated to the at least one memory die.

16. The non-transitory computer-readable storage medium of claim 15, wherein the type of auxiliary data is communicated as a data packet comprising a set of bits defined by a token ring resolution.

17. The non-transitory computer-readable storage medium of claim 15, wherein each communication frequency of the set of communication frequencies is a PPM cycle value of a respective type of auxiliary data, and wherein determining whether to communicate auxiliary data to the at least one memory die comprises determining whether a PPM cycle index of the current PPM cycle is a multiple of at least one PPM cycle value.

18. The non-transitory computer-readable storage medium of claim 15, wherein selecting the type of auxiliary data comprises selecting, from a plurality of types of auxiliary data eligible to be communicated during the current PPM cycle, the type of auxiliary data as a type of auxiliary data having a lowest communication frequency.

19. The non-transitory computer-readable storage medium of claim 18, wherein each unselected type of auxiliary data of the plurality of types of auxiliary data eligible to be communicated during the current PPM cycle is communicated in accordance with a respective offset, and wherein each offset defines how long after the current PPM cycle that the unselected type of auxiliary data will be communicated.

20. The non-transitory computer-readable storage medium of claim 19, wherein each communication frequency of the set of communication frequencies is a PPM cycle value of a respective type of auxiliary data, and wherein each offset is a respective PPM cycle index offset relative to a PPM cycle index of the current PPM cycle.

* * * * *